US006558735B2

(12) United States Patent
Marcus et al.

(10) Patent No.: US 6,558,735 B2
(45) Date of Patent: May 6, 2003

(54) REUSABLE MASS-SENSOR IN MANUFACTURE OF ORGANIC LIGHT-EMITTING DEVICES

(75) Inventors: Michael A. Marcus, Honeoye Falls, NY (US); Anna L. Hrycin, Rochester, NY (US); Steven A. Van Slyke, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 124 days.

(21) Appl. No.: 09/839,886

(22) Filed: Apr. 20, 2001

(65) Prior Publication Data

US 2002/0187253 A1 Dec. 12, 2002

(51) Int. Cl.[7] .............................................. C23C 14/00
(52) U.S. Cl. .............................. 427/9; 427/10; 427/66; 427/532; 427/534; 427/553; 427/554; 427/255.6; 118/664; 134/1; 134/2; 134/18; 134/19
(58) Field of Search .................. 427/9, 10, 66, 427/532, 534, 553, 554, 255.6; 118/664; 134/1, 2, 18, 19

(56) References Cited

U.S. PATENT DOCUMENTS 3,586,854 A * 6/1971 Zega ........................ 250/354.1
3,689,747 A * 9/1972 Di Milia et al. ............ 700/266
4,036,167 A * 7/1977 Lu ............................. 118/664
4,356,429 A   10/1982 Tang
4,539,507 A    9/1985 VanSlyke et al.
4,720,432 A    1/1988 VanSlyke et al.
4,769,292 A    9/1988 Tang et al.
5,025,664 A * 6/1991 Kendrick et al. ............. 73/579
5,112,642 A * 5/1992 Wajid ......................... 427/10
5,550,066 A    8/1996 Tang et al.
5,863,379 A * 1/1999 Ushida et al. ............. 156/378
6,362,339 B1 * 3/2002 McCormick ................... 546/7

* cited by examiner

Primary Examiner—Richard Bueker
(74) Attorney, Agent, or Firm—Raymond L. Owens

(57) ABSTRACT

A method for controlling the deposition of an organic layer in making an organic light-emitting device includes depositing at a deposition zone organic material forming a layer of the organic light-emitting device and providing a movable sensor which, when moved into the deposition zone and is being coated during the depositing step, provides a signal representing the deposition rate and thickness of the organic material forming the layer. The method also includes controlling the deposition of the organic material in response to the signal to control the deposition rate and thickness of the deposited organic material forming the layer, moving the movable sensor from the deposition zone to a cleaning position, and removing organic material from the movable sensor to permit reuse of the movable sensor.

2 Claims, 12 Drawing Sheets

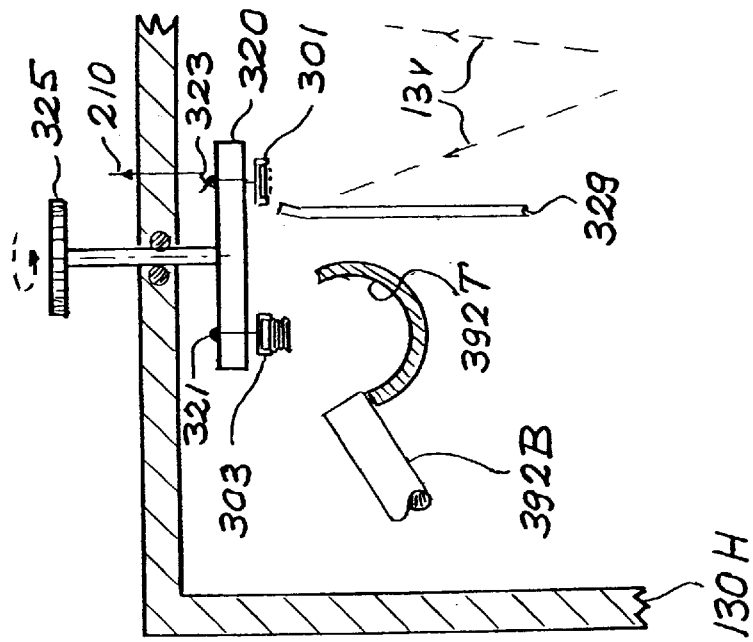
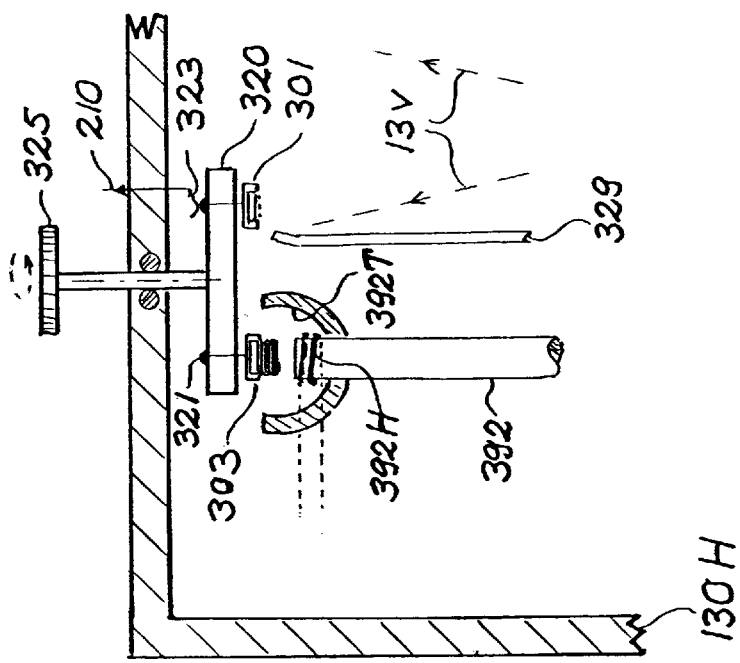
FIG. 7B
FIG. 7A

REUSABLE MASS-SENSOR IN MANUFACTURE OF ORGANIC LIGHT-EMITTING DEVICES

CROSS REFERENCE TO RELATED APPLICATIONS

Reference is made to commonly assigned U.S. patent application Ser. No. 09/839,885 filed concurrently herewith entitled "Controlling the Thickness of an Organic Layer in an Organic Light-Emitting Device" by Steven A. Van Slyke et al., the disclosure of which is incorporated herein by reference.

FIELD OF THE INVENTION

The present invention relates generally to monitoring and controlling formation of organic layers by physical vapor deposition in making organic light-emitting devices.

BACKGROUND OF THE INVENTION

An organic light-emitting device, also referred to as an organic electroluminescent device, can be constructed by sandwiching two or more organic layers between first and second electrodes.

In a passive matrix organic light-emitting device of conventional construction, a plurality of laterally spaced light-transmissive anodes, for example indium-tin-oxide (ITO) anodes are formed as first electrodes on a light-transmissive substrate such as, for example, a glass substrate. Two or more organic layers are then formed successively by vapor deposition of respective organic materials from respective sources, within a chamber held at reduced pressure, typically less than $10^{-3}$ Torr. A plurality of laterally spaced cathodes are deposited as second electrodes over an uppermost one of the organic layers. The cathodes are oriented at an angle, typically at a right angle, with respect to the anodes.

Such conventional passive matrix organic light-emitting devices are operated by applying an electrical potential (also referred to as a drive voltage) between appropriate columns (anodes) and, sequentially, each row (cathode). When a cathode is biased negatively with respect to an anode, light is emitted from a pixel defined by an overlap area of the cathode and the anode, and emitted light reaches an observer through the anode and the substrate.

In an active matrix organic light-emitting device, an array of anodes are provided as first electrodes by thin-film transistors (TFTs) which are connected to a respective light-transmissive portion. Two or more organic layers are formed successively by vapor deposition in a manner substantially equivalent to the construction of the aforementioned passive matrix device. A common cathode is deposited as a second electrode over an uppermost one of the organic layers. The construction and function of an active matrix organic light-emitting device is described in U.S. Pat. No. 5,550,066, the disclosure of which is herein incorporated by reference.

Organic materials, thicknesses of vapor-deposited organic layers, and layer configurations, useful in constructing an organic light-emitting device, are described, for example, in U.S. Pat. Nos. 4,356,429; 4,539,507; 4,720,432; and 4,769,292, the disclosures of which are herein incorporated by reference.

In order to provide an organic light-emitting device which is substantially uniform and of precise thickness, the formation of organic layers of the device has to be monitored or controlled. Such control of vapor deposition of organic layers by sublimation or evaporation of organic material from a source is typically achieved by positioning a monitor device within the same vapor deposition zone in which the substrate or structure is to be coated with the organic layer. Thus, the monitor device receives an organic layer at the same time as the organic layer is being formed on the substrate or structure. The monitor device, in turn, provides an electrical signal which is responsive to a rate at which the organic layer is being formed on the monitor device and, therefore, related to a rate at which the organic layer is being formed on the substrate or structure which will provide the organic light-emitting device. The electrical signal of the monitor device is processed and/or amplified, and is used to control the rate of vapor deposition and the thickness of the organic layer being formed on the device substrate or structure by adjusting a vapor source temperature control element, such as, for example, a source heater.

Well known monitor devices are so-called crystal mass-sensor devices in which the monitor is a quartz crystal having two opposing electrodes. The crystal is part of an oscillator circuit provided in a deposition rate monitor. Within an acceptable range, a frequency of oscillation of the oscillator circuit is approximately inversely proportional to a mass-loading on a surface of the crystal occasioned by a layer or by multiple layers of material deposited on the crystal. When the acceptable range of mass-loading of the crystal is exceeded, for example by build-up of an excess number of deposited layers, the oscillator circuit can no longer function reliably, necessitating replacement of the "overloaded" crystal with a new crystal mass-sensor. Such replacement, in turn, requires discontinuation of the vapor deposition process.

In addition, when certain types of organic layers are deposited onto crystal mass-sensor devices there can be a tendency for the layers to start cracking and flaking from the mass-sensor surface after coating thickness build-up on the order of 500–2,000 nanometer (nm). This can cause the crystal mass-sensor to become inaccurate in its coating rate measurement capability at thicknesses well below the aforementioned mass-loading limit.

In development efforts, several organic light-emitting devices can typically be prepared before a crystal mass-sensor must be replaced due to excessive mass-loading or cracking and flacking of a deposited film. This does not present a problem in such efforts, since other considerations usually require disruption of vapor deposition by opening the deposition chamber for manual replacement of substrates or structures, replenishment of organic material in relatively small vapor sources, and the like.

However, in a manufacturing environment, designed for repeatedly making a relatively large number of organic light-emitting devices, replacement of "overloaded" crystal mass-sensors or cracked and flaking organic coatings on crystal mass-sensors would constitute a serious limitation because a manufacturing system is configured in all aspects to provide the capacity of producing all organic layers on numerous device structures and, indeed, to produce fully encapsulated organic light-emitting devices.

SUMMARY OF THE INVENTION

It is, therefore, an object of the present invention to form an organic layer by providing a reusable sensor for controlling the thickness of such layer. This object is achieved in a method for depositing an evaporated or sublimed organic layer onto a structure which will form part of an organic light-emitting device, comprising the steps of:

a) depositing at a deposition zone organic material forming a layer of the organic light-emitting device;

b) providing a movable sensor which, when moved into the deposition zone and is being coated during the depositing step, provides a signal representing the thickness of the organic material forming the layer;

c) controlling the deposition of the organic material in response to the signal to control a deposition rate and thickness of the organic layer formed on the structure;

d) moving the movable sensor from the deposition zone to a cleaning position; and e) removing organic material from the movable sensor to permit reuse of the movable sensor.

It is an advantage of the present invention that crystal mass-sensors which control the thickness of one or more organic layers in a light-emitting device can be cleaned and reused thereby providing a more efficient manufacturing process.

BRIEF DESCRIPTION OF THE DRAWINGS

FIG. 7A shows the light guide of FIG. 7 which further includes an optional heater positioned adjacent the tip of the light guide and an optional trap for collecting organic material removed from the sensor by a cleaning flash;

FIG. 7B shows schematically the light guide directed obliquely towards the mass-loaded sensor and an optional trap for collecting organic material removed from the sensor by a cleaning flash;

The drawings are necessarily of a schematic nature since layer thickness dimensions of OLEDs are frequently in the sub-micrometer ranges, while features representing lateral device dimensions can be in a range of 50–500 millimeter. Accordingly, the drawings are scaled for ease of visualization rather than for dimensional accuracy.

The term "substrate" denotes a light-transmissive support having a plurality of laterally spaced first electrodes (anodes) preformed thereon, such substrate being a precursor of a passive matrix OLED. The term "structure" is used to describe the substrate once it has received a portion of a vapor deposited organic layer, and to denote an active matrix array as a distinction over a passive matrix precursor.

DETAILED DESCRIPTION OF THE INVENTION

Figure 1:
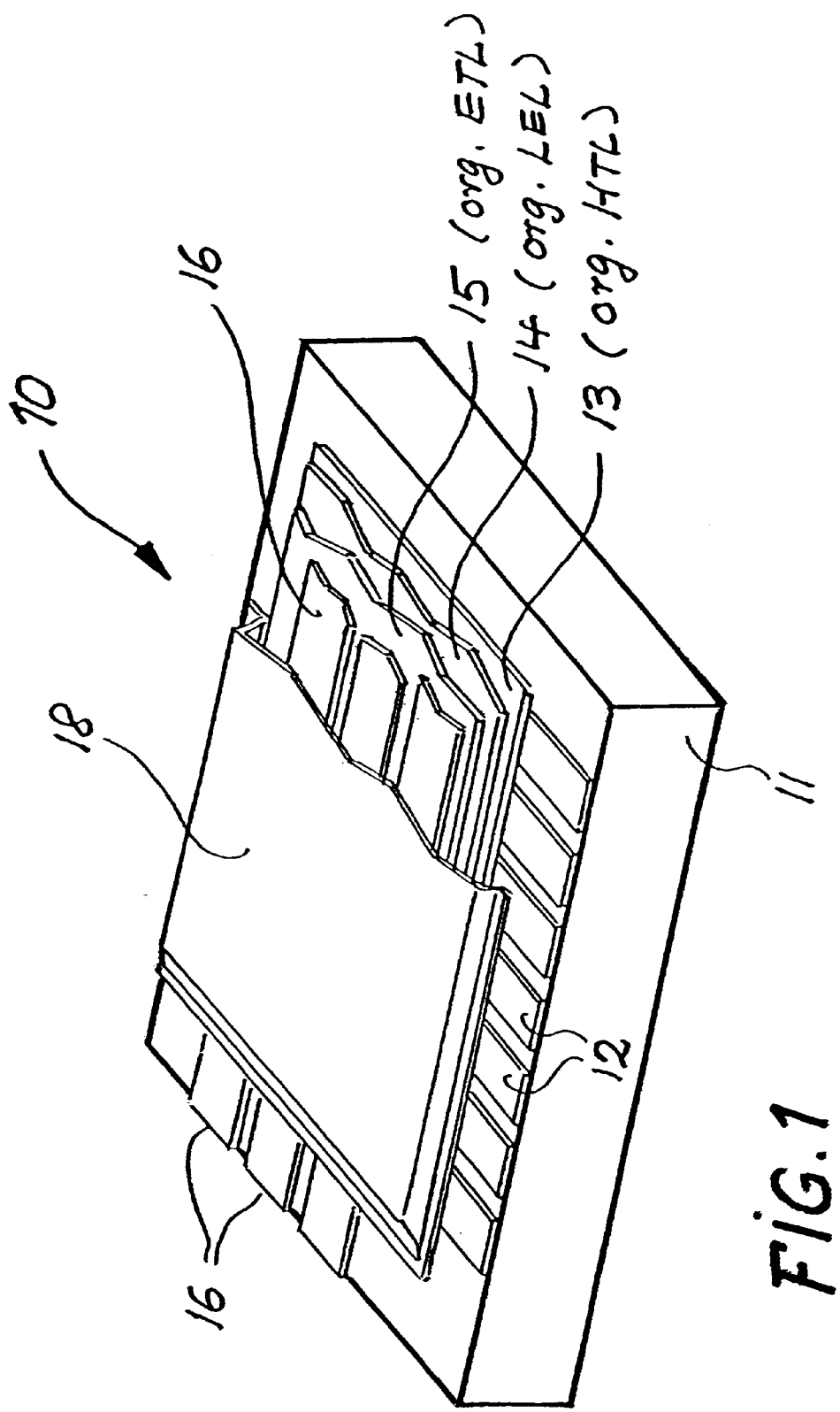
FIG. 1 is a schematic perspective view of a passive matrix organic light-emitting device having partially peeled-back elements to reveal various layers.

Turning to FIG. 1, a schematic perspective view of a passive matrix organic light-emitting device (OLED) 10 is shown having partially peeled-back elements to reveal various layers.

A light-transmissive substrate 11 has formed thereon a plurality of laterally spaced first electrodes 12 (also referred to as anodes). An organic hole-transporting layer (HTL) 13, an organic light-emitting layer (LEL) 14, and an organic electron-transporting layer (ETL) 15 are formed in sequence by a physical vapor deposition, as will be described in more detail hereinafter. A plurality of laterally spaced second electrodes 16 (also referred to as cathodes) are formed over the organic electron-transporting layer 15, and in a direction substantially perpendicular to the first electrodes 12. An encapsulation or cover 18 seals environmentally sensitive portions of the structure, thereby providing a completed OLED 10.

Figure 2:
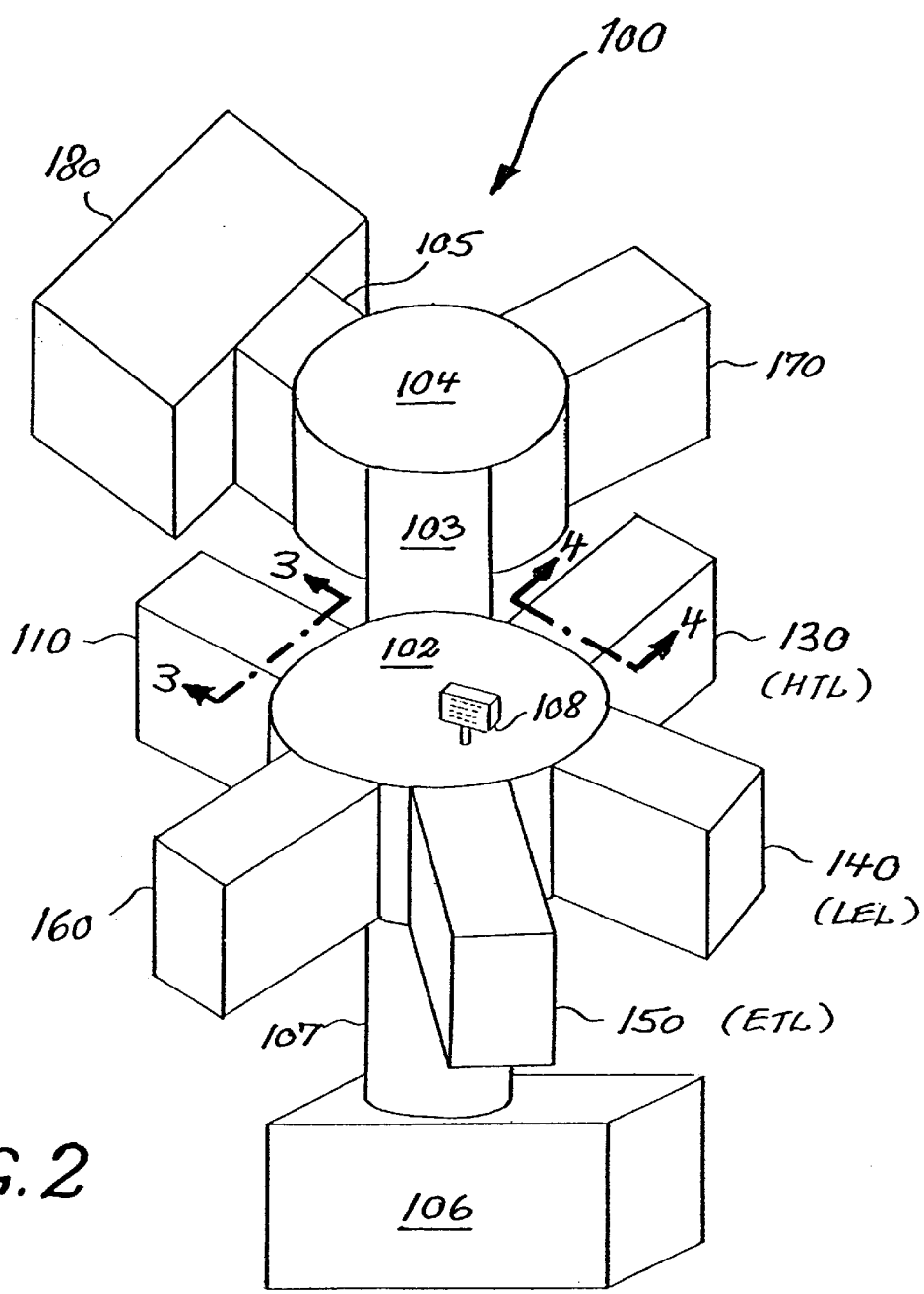
FIG. 2 is a schematic perspective view of a manufacturing system suitable for manufacture of a relatively large number of organic light-emitting devices (OLEDs) and having a plurality of stations extending from hubs.

Turning to FIG. 2, a schematic perspective view of a manufacturing system 100 is shown which is suitable for manufacture of a relatively large number of organic light-emitting devices using automated or robotic means (not shown) for transporting or transferring substrates or structures among a plurality of stations extending from a buffer hub 102 and from a transfer hub 104. A vacuum pump 106 via a pumping port 107 provides reduced pressure within the hubs 102, 104, and within each of the stations extending from these hubs. A pressure gauge 108 indicates the reduced pressure within the system 100. The pressure can be in a range from about $10^{-2}$ to $10^{-6}$ Torr.

The stations include a load station 110 for providing a load of substrates or structures, a vapor deposition station 130 dedicated to forming organic hole-transporting layers (HTL), a vapor deposition station 140 dedicated to forming organic light-emitting layers (LEL), a vapor deposition station 150 dedicated to forming organic electron-transporting layers (ETL), a vapor deposition station 160 dedicated to forming the plurality of second electrodes (cathodes), an unload station 103 for transferring structures from the buffer hub 102 to the transfer hub 104 which, in turn, provides a storage station 170, and an encapsulation station 180 connected to the hub 104 via a connector port 105. Each of these stations has an open port extending into the hubs 102 and 104, respectively, and each station has a vacuum-sealed access port (not shown) to provide access to a station for cleaning, replenishing materials, and for replacement or repair of parts. Each station includes a housing which defines a chamber.

Figure 3:
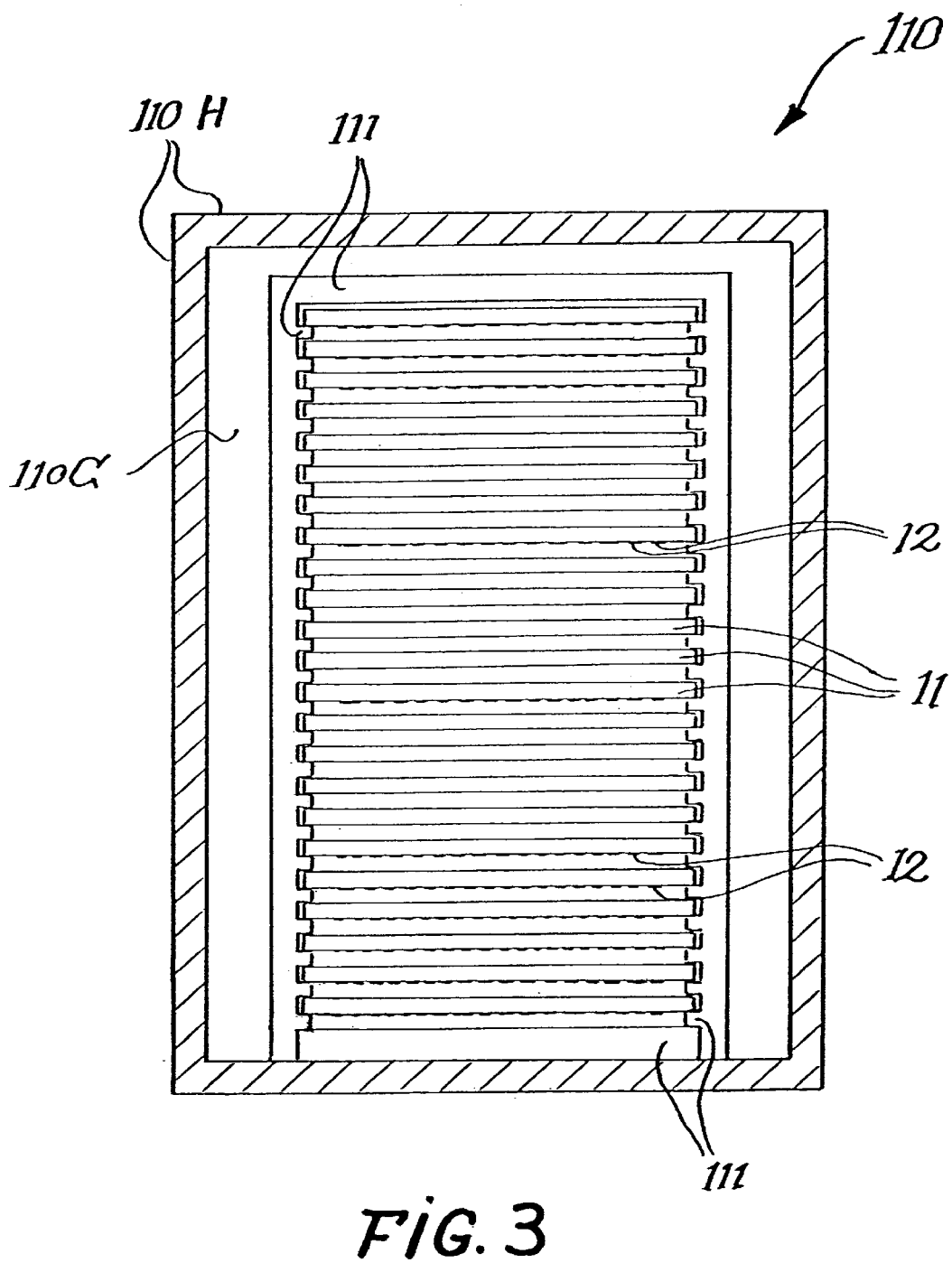
FIG. 3 is a schematic section view of a carrier containing a relatively large number of substrates or structures, and positioned in a load station of the system of FIG. 2 as indicated by section lines 3—3 in FIG. 2.

FIG. 3 is a schematic section view of the load station 110, taken along section lines 3—3 of FIG. 2. The load station 110 has a housing 110H which defines a chamber 110C. Within the chamber is positioned a carrier 111 designed to carry a plurality of substrates 11 having preformed first electrodes 12 (see FIG. 1). An alternative carrier 111 can be provided for supporting a plurality of active matrix structures. Carriers 111 can also be provided in the unload station 103 and in the storage station 170.

Figure 4:
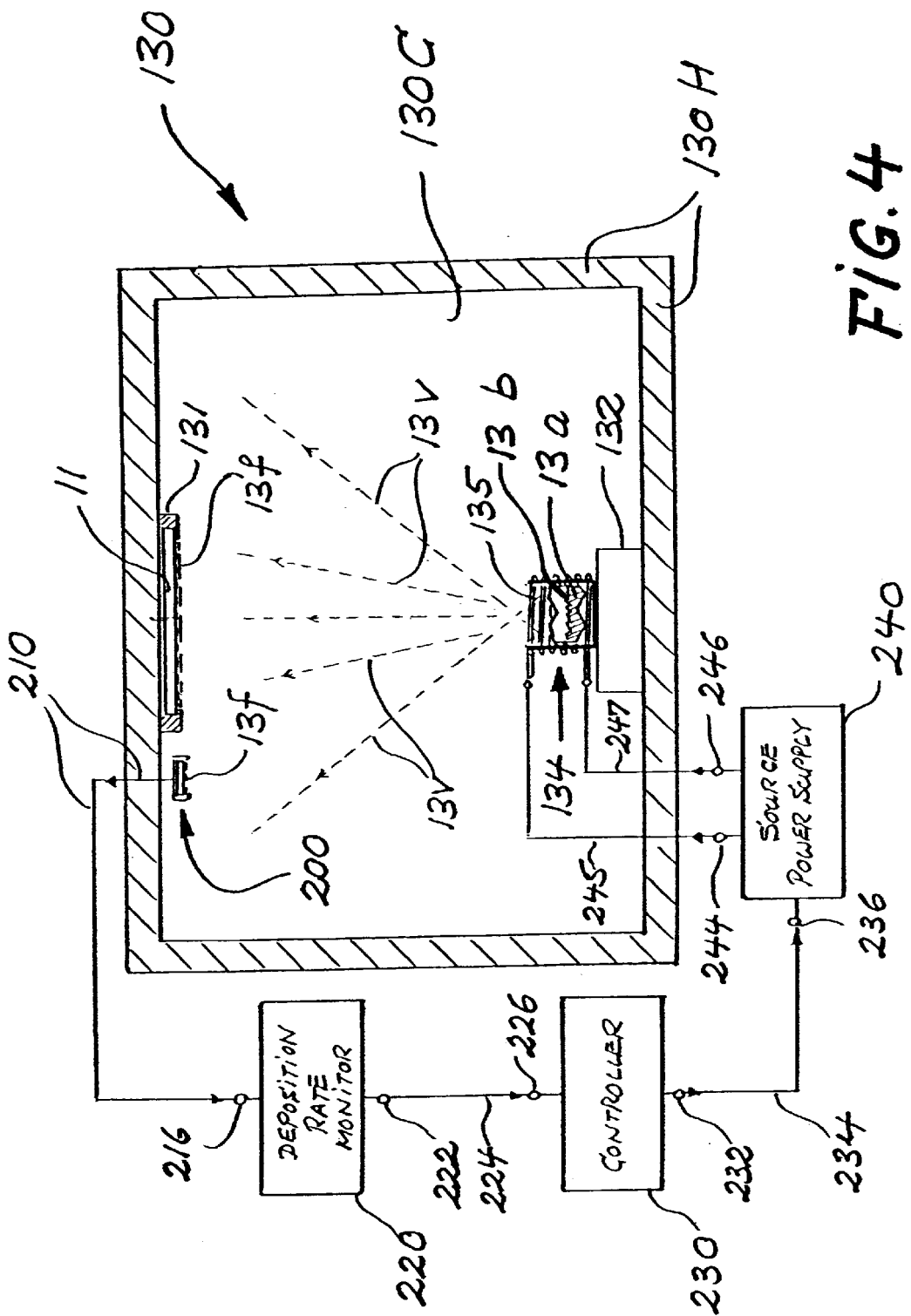
FIG. 4 is a schematic section view of a vapor deposition station dedicated to forming vapor deposited organic hole-transporting layers (HTL) on a substrate or structure in the system of FIG. 2 as indicated by section lines 4—4 in FIG. 2.

Turning to FIG. 4, a schematic cross section view of the HTL vapor deposition station 130 is shown, taken along the section lines 4—4 of FIG. 2. A housing 130H defines a chamber 130C. A substrate 11 (see FIG. 1) is held in a holder 131 which can be constructed as a mask frame. A source 134 is positioned on a thermally insulative support 132, the source 134 filled with a supply of organic hole-transporting material 13a to a level 13b. The source 134 is heated by heating elements 135 which are connected via leads 245 and 247 to corresponding output terminals 244 and 246 of a source power supply 240.

When a source temperature is sufficiently elevated, the organic hole-transporting material 13a will evaporate or sublime and thus provide a deposition zone 13v of vapor of organic hole-transporting material, indicated schematically by dashed lines and arrows.

The substrate 11 as well as a conventional crystal mass-sensor 200 are positioned within the deposition zone, and each of these elements has an organic hole-transporting layer being formed thereon as indicated by the designation 13f, shown in dashed outline.

As is well known in the art, the crystal mass-sensor 200 is connected via a lead 210 to an input terminal 216 of a deposition rate monitor 220. The sensor 200 is part of an oscillator circuit provided in the monitor 220 and the circuit oscillates at a frequency which is approximately inversely proportional to a mass-loading of the crystal such as by a mass-loading provided by the layer 13f being formed. The monitor 220 includes a differentiating circuit which generates a signal proportional to a rate of mass-loading, i.e. proportional to a rate of deposition of the layer 13f. This signal is indicated by the deposition rate monitor 220, and is provided at an output terminal 222 thereof. A lead 224 connects this signal to an input terminal 226 of a controller or amplifier 230 which provides an output signal at an output terminal 232. The latter output signal becomes an input signal to the source power supply 240 via lead 234 and input terminal 236.

Thus, if the vapor stream within the vapor deposition zone 13v is temporally stable, the mass build-up or growth of the layer 13f will proceed at a constant rate. The rate monitor 220 will provide a constant signal at output terminal 222, and the source power supply 240 will provide a constant current to the heating elements 135 of the source 134 via the leads 245 and 247, thereby maintaining the temporally stable vapor stream within the deposition zone. Under stable vapor deposition conditions, i.e. conditions of a constant deposition rate, a desired final thickness of an organic hole-transporting layer 13 (see FIG. 1) is achieved on the structure and on the crystal mass-sensor 200 during a fixed deposition duration, at which time the vapor deposition is terminated by terminating the heating of the source 134, or by positioning a shutter (not shown) over the source.

While a relatively simple source 134 is shown in FIG. 4 for illustrative purposes, it will be appreciated that numerous other source configurations can be effectively used to provide evaporated or sublimed vapors of organic materials within a deposition zone. Particularly useful sources are extended or linear physical vapor deposition sources disclosed by R. G. Spahn in U.S. patent application Ser. No. 09/518,600, filed Mar. 3, 2000, and commonly assigned.

Figure 5:
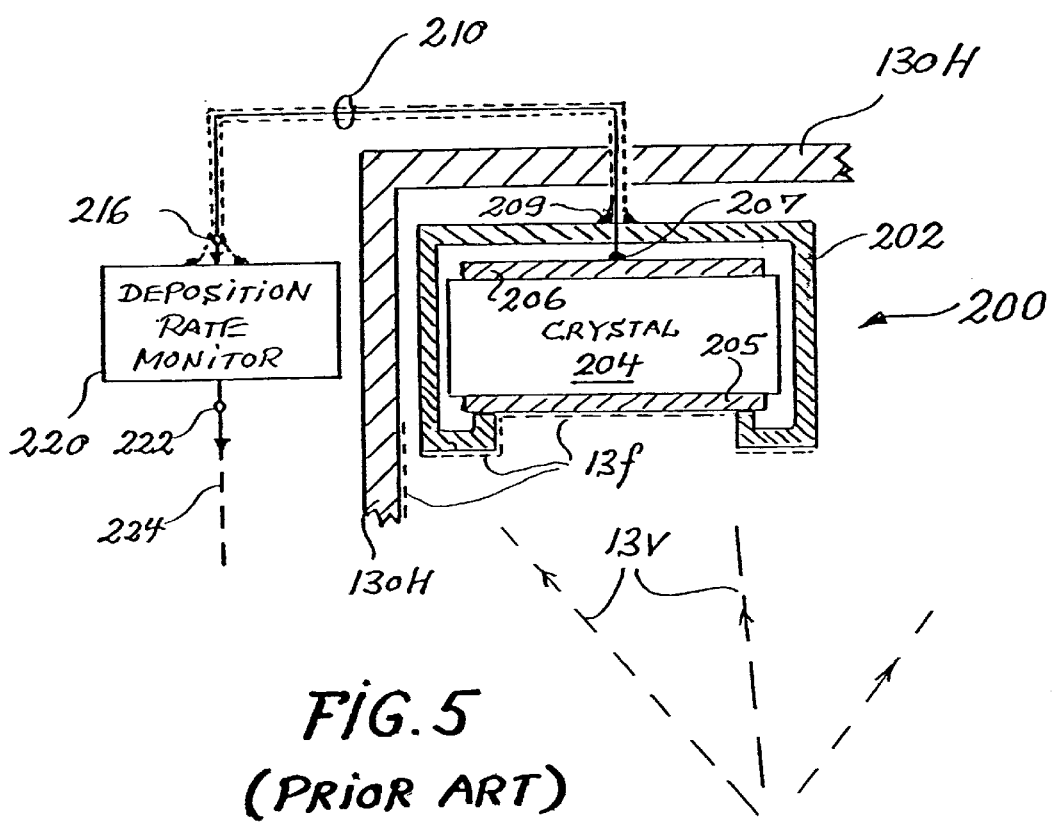
FIG. 5 is an enlarged schematic section view of a crystal mass-sensor shown in FIG. 4 and associated deposition rate monitor.

FIG. 5 is an enlarged schematic section view of the prior art crystal mass-sensor 200 shown in FIG. 4, together with the associated deposition rate monitor 220. The crystal 204 has a front electrode 205 and a rear electrode 206. An electrically grounded casing 202 is in electrical contact with the front electrode 205 and via a connection 209 to a shielded portion of the lead 210. The oscillator-signal-carrying portion of lead 210 is connected to the rear electrode 206 by a connector 207. Portions of the housing 130H, the vapor deposition zone 13v, and the organic hole-transporting layer 13f being formed on the front electrode 205 and front portions of the casing 202 correspond to the respective elements of FIG. 4.

Generally, the casing 202 of the crystal mass-sensor is water cooled (not shown in the drawings). The water cooling maintains a stable crystal temperature and ensures that the deposition monitoring is accurate and uninfluenced by thermal effects.

Figure 6:
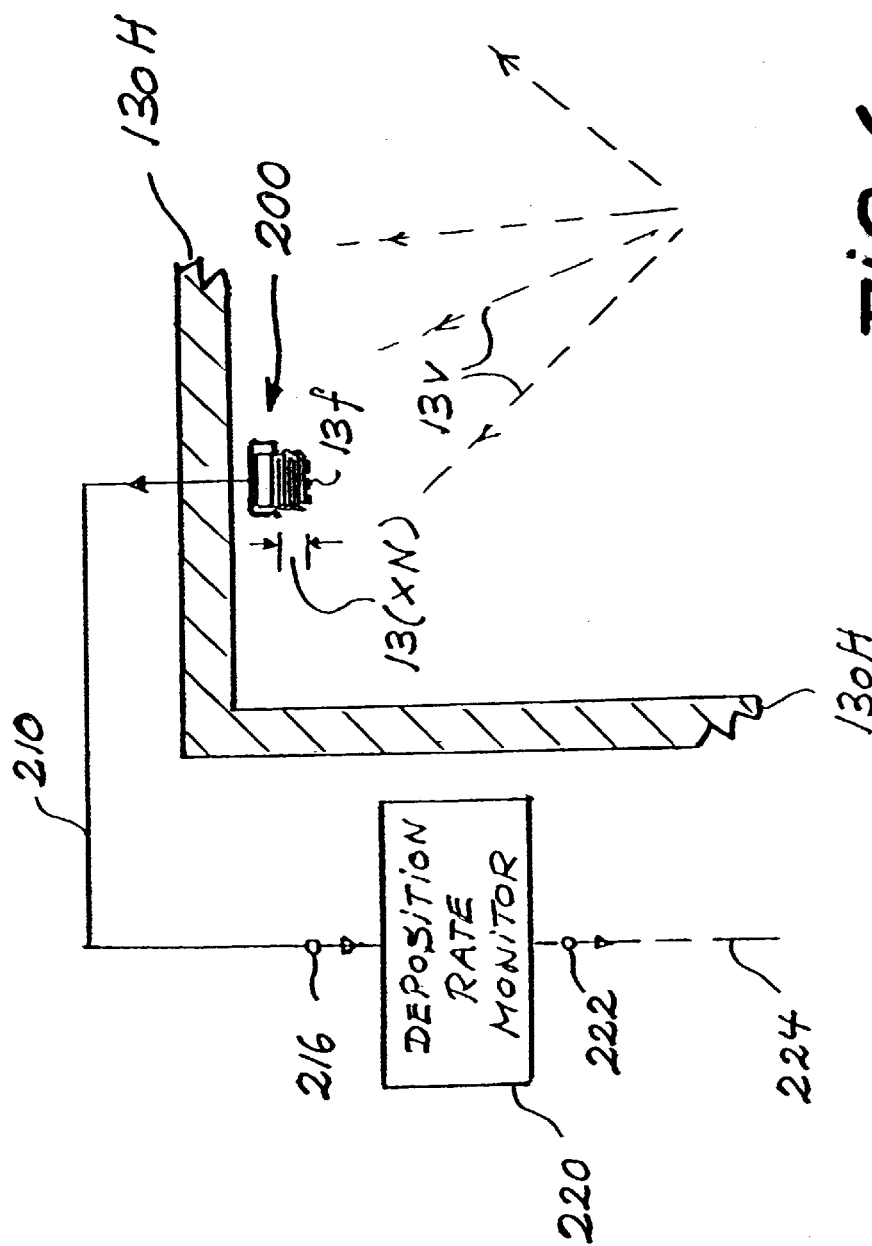
FIG. 6 shows schematically the sensor of FIG. 4 having formed on one surface a relatively high mass-loading in the form of a number N of layers of organic hole-transporting material wherein such mass-loading of a prior art sensor would cause the associated deposition rate monitor to become unreliable in its reading of deposition rate, or to become inoperative.

FIG. 6 shows schematically the crystal mass-sensor 200 of FIG. 4 now having a relatively high mass-loading in the form of a number N of layers of organic hole-transporting material 13. At such relatively high mass-loading (due to cumulative deposition of layers as N substrates or structures in succession received an organic hole-transporting layer 13) the deposition rate monitor 220 may become inoperative or become unreliable in its reading of a deposition rate.

The monitor 220 may also become unreliable due to cracking, peeling or flaking of portions of the organic material deposited on the sensor at thicknesses lower than a thickness corresponding to N successive layers.

Figure 7:
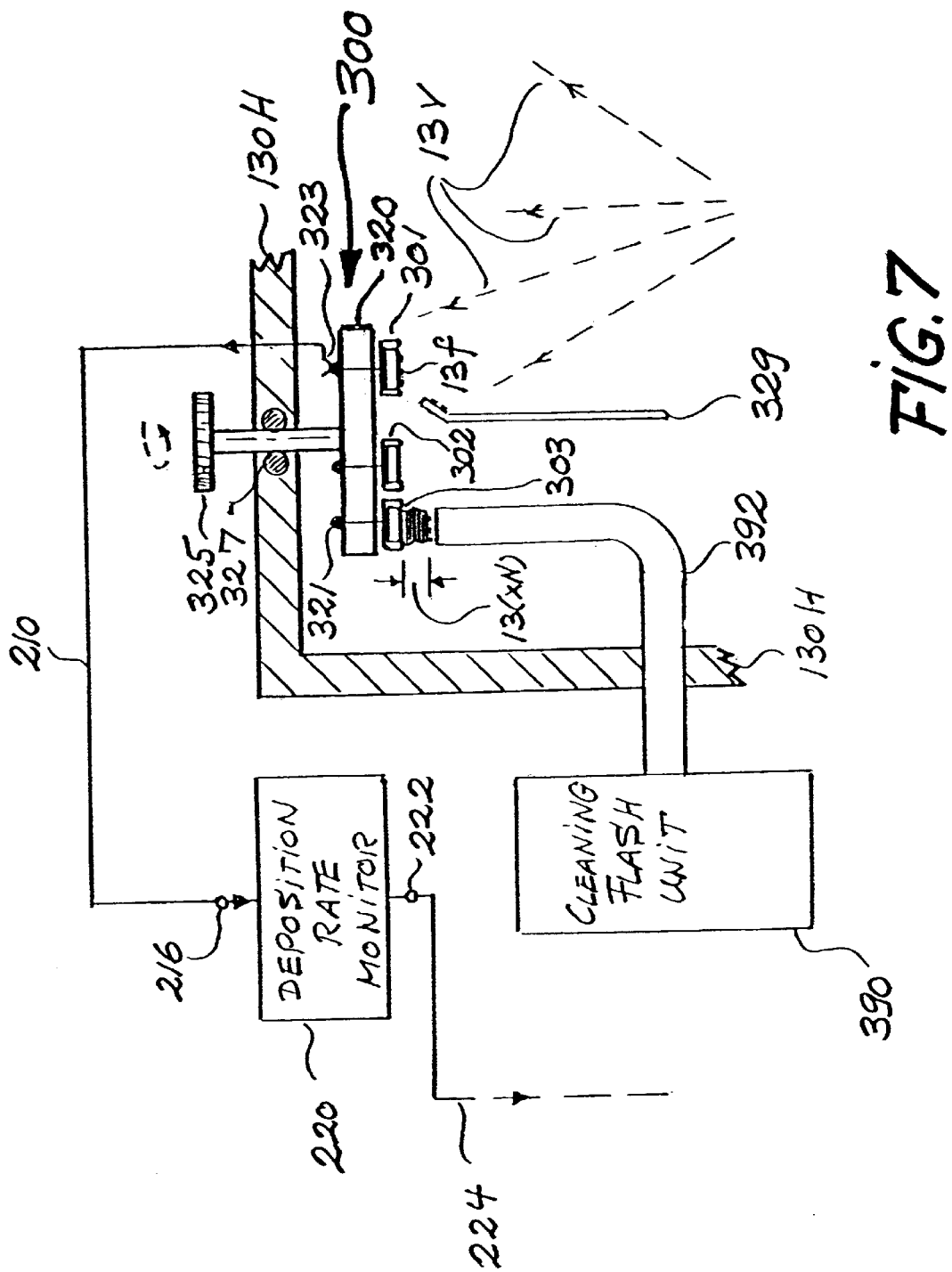
FIG. 7 shows schematically, positioned within the HTL deposition station of FIG. 2, a movable sensor assembly in accordance with the invention in which a first crystal mass-sensor is operative in a deposition zone while a third sensor is shown positioned proximate a light guide for providing a cleaning flash, with a second sensor depicted after cleaning and in a position to advance into the deposition zone as the first sensor accumulates a relatively high mass-loading.

Turning now to FIG. 7, there is shown one embodiment of a mass-sensor assembly 300 in accordance with the present invention, replacing the single fixedly positioned mass-sensor 200 shown in FIGS. 4, 5, and 6.

A rotatably movable sensor support 320 is depicted for illustrative purposes as supporting three crystal mass-sensors 301, 302, and 303. Sensor 301 is positioned and operative in the vapor deposition zone 13v (together with a substrate or structure as shown in FIG. 4) as described previously. A lead is connected to a rear electrode of each crystal (see FIG. 5) and a lead contact 323 (such as, for example, a spring-biased contact) engages a sensor contact 321 (of sensor 301) formed on the electrically insulative sensor support 320.

The sensor support 320 is rotatably disposed in the housing 130H of the station 130 (see FIG. 2) via a seal 327, and can be rotated by a rotator 325 in a manual mode as depicted here, or in an automated indexed rotation mode via a stepper motor or the like.

While the sensor 301 is operative in the deposition zone, a sensor 303 is shown positioned proximate a light guide 392 which will provide from a cleaning flash unit 390 a flash of radiation sufficiently powerful to remove the multi-layer mass-loading 13 (xN) from this sensor 303 by heat-induced sublimation or evaporation, or to remove an organic deposit which may be partially cracked, peeled or flaked at reduced mass-loading. Such cleaning or removal of organic material from sensor 303 is effected by sublimation or evaporation in a manner substantially equivalent to formation of organic vapors in the vapor deposition zone 13v by sublimation or by evaporation of organic material 13a from the source 134. The flash of radiation provided by cleaning flash unit 390 is of a magnitude sufficient to raise the temperature of the organic material deposited on the sensor to a temperature sufficient to initiate sublimation or evaporation of the organic material, but remain below the temperature required to remove the metal electrode on the sensor 303 or to adversely effect the performance of the sensor 303. Organic materials useful for organic light emitting devices are particularly amenable to this technique because these materials are vaporized at temperatures significantly below the temperatures required to vaporize most inorganic materials such as the electrode materials commonly used for crystal mass sensors. Once the sensor 303 is cleaned, it can be then positioned in the deposition zone 13v and be utilized again for monitoring the deposition rate and thickness of the organic layer without opening the deposition chamber 130C and thereby releasing the vacuum.

A sensor 302 is shown after cleaning, and in a position on the sensor support to advance into the deposition zone as the sensor 301 accumulates an undesirably high mass-loading.

A shield 329 is positioned to provide vapor deposition onto one sensor in the deposition zone, and to protect other sensors from vapor deposition.

It will be appreciated that the light guide 392 is coupled through the housing 130H via a vacuum-sealed feed-through (not shown). Similarly, all electrical leads enter or exit the chamber 130C through the housing 130 via a corresponding electrical feed-through. Such feed-through elements are well known in the art of vacuum systems technology.

The light guide 392 can be an optical fiber cable constructed of a material which transmits light provided by the cleaning flash unit 390. Alternatively, the light guide 392 can be constructed as a hollow or tubular light-transmissive element.

In FIG. 7A, the light guide 392 includes an optional heater 392H positioned adjacent to the tip, or at the tip, of the light guide, and an optional trap 392T. The purpose of the heater 392H is to heat the optically active tip area of the light guide 392 so that organic sublimate (removed organic material) vaporized from the surface of the sensor 303 is prevented from depositing on the tip area of the light guide. The trap 392 is used to collect the sublimate and inhibit spreading of such sublimate throughout the chamber 130C. The trap 392T may be cooled to enhance condensation of the organic sublimate within the trap.

FIG. 7B shows a light guide 392B in a configuration which can direct light from the cleaning flash unit 390 under an oblique angle towards the mass-loaded sensor. The trap 392T functions in a manner described with reference to FIG. 7A. The oblique incidence of a cleaning flash on the organic deposits on the mass-sensor 303 can obviate the need for a heater at the tip of the light guide 392B.

Figure 7C:
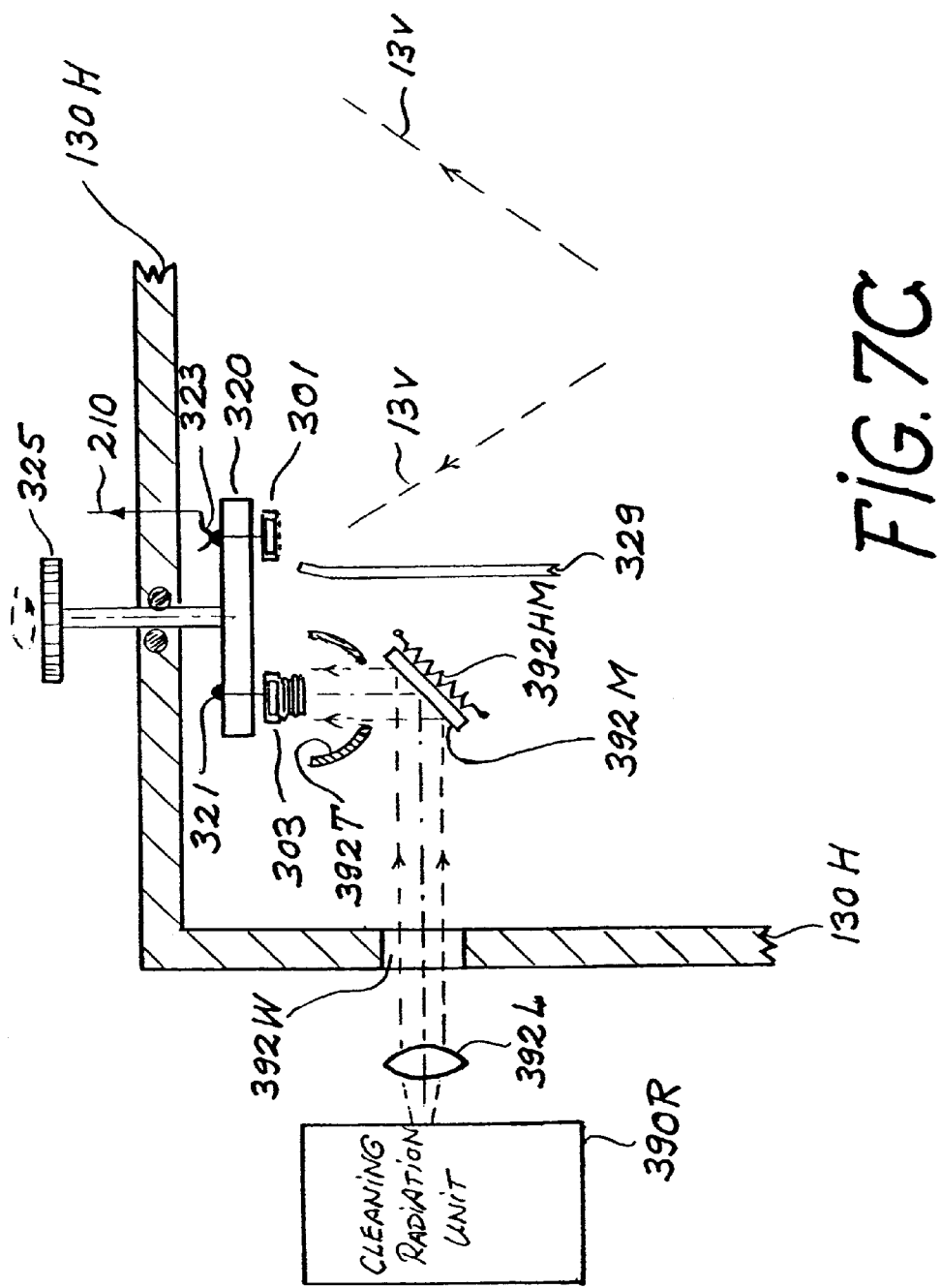
FIG. 7C shows schematically an alternative optical cleaning configuration for removing organic material from a sensor in which a cleaning radiation source provides cleaning radiation directed towards a mass-loaded sensor via lenses, a window positioned in the chamber housing, and an optionally heatable mirror.

FIG. 7C shows schematically an alternative optical cleaning configuration for removing organic material from a mass-sensor. A cleaning radiation source 390R provides cleaning radiation as a flash or as a timed beam of radiation (for example, a timed beam from a laser light source) which is directed towards the organic deposits on the mass-sensor 303 via a lens or lenses 392L, a radiation-transmissive window 392W in the housing 130H, and a mirror 392M which can be optionally heated by a heater 392HM. The trap 392T is operative as described above.

Figure 8:
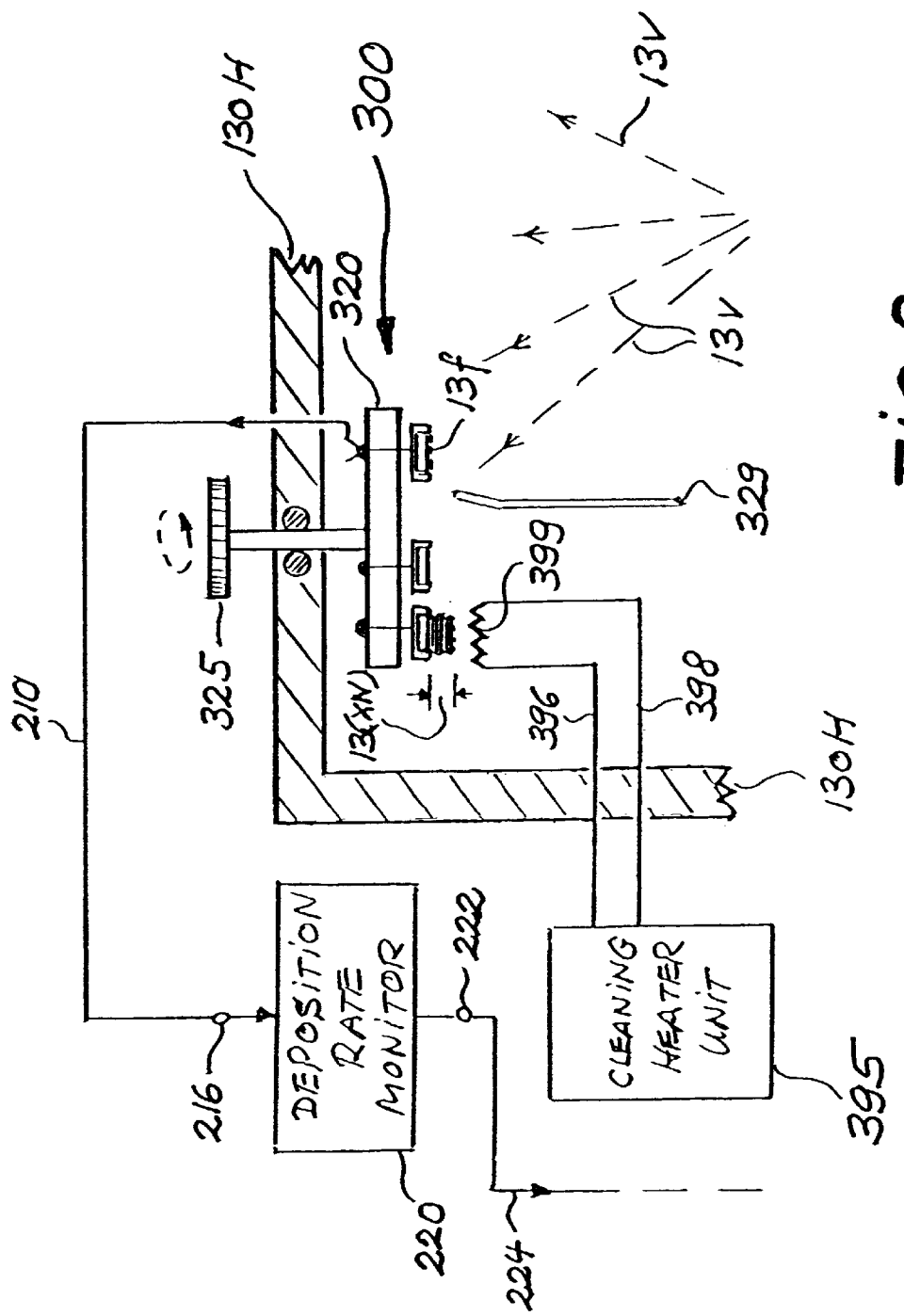
FIG. 8 is a view of the movable sensor assembly of FIG. 7 but showing schematically a heater for cleaning the sensor having the high mass-loading in accordance with the invention.

Turning now to FIG. 8, there is shown the sensor assembly 300 of FIG. 7 in which the light guide 392 and the cleaning flash unit 390 is replaced by a heater 399 connected to a cleaning heater unit 395 via leads 396 and 398. An optional trap equivalent in function to element 392T in FIG. 7 can be included in the sensor assembly of FIG. 8 surrounding the heater 399 to collect the sublimate and inhibit sublimate spreading throughout the vacuum chamber.

Optionally, the heater 399 can be incorporated into the casing 202 of the mass-sensor. In this case, it is desirable to not water cool the sensor casing at the cleaning position in which the sublimate of organic layers is removed.

FIGS. 9A–9D are schematic plan views of different embodiments of rotatable sensor supports which are useful in the practice of the invention. Positions of a sensor 301 in the deposition zone are indicated by the location of the shield 329, shown in dashed outline, and sensor cleaning positions 392 (the light guide 392 of FIG. 7) are also depicted in dashed outline.

Figure 9A:
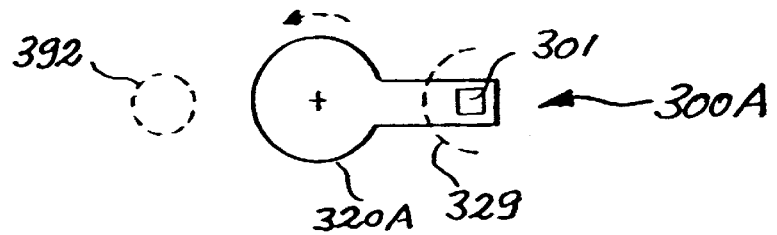
FIGS. 9A–9D are schematic plan views of different embodiments of rotatable sensor supports useful in the practice of the invention, with positions of sensors in the deposition zone and sensor cleaning positions indicated in dashed outlines.

FIG. 9A shows a mass-sensor assembly 300A with a rotatable sensor support 320A having a single sensor 301 supported thereon.

Figure 9B:
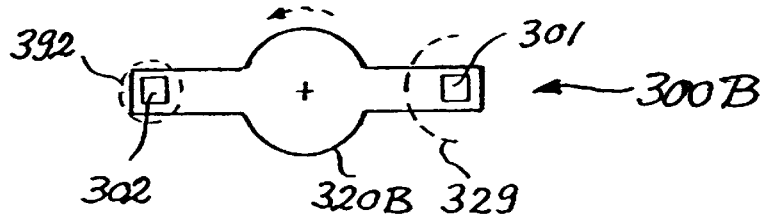

FIG. 9B shows a mass-sensor assembly 300B with two sensors 301, 302 disposed on a rotatable sensor support 320B.

Figure 9C:
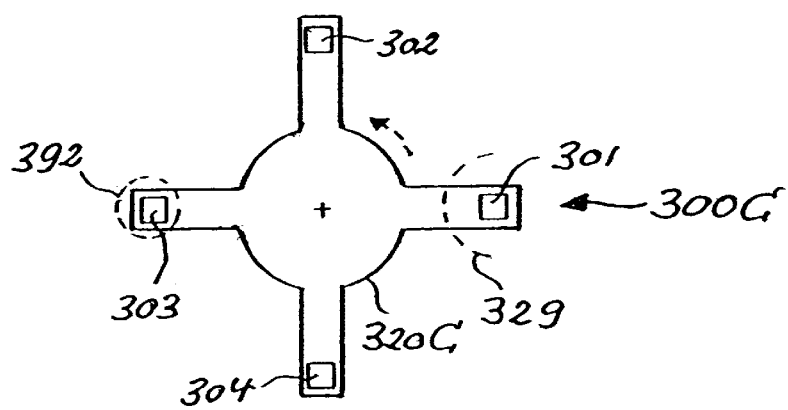

FIG. 9C shows a mass-sensor assembly 300C which provides a rotatable sensor support 320C adapted to support four sensors 301, 302, 303, and 304.

Figure 9D:
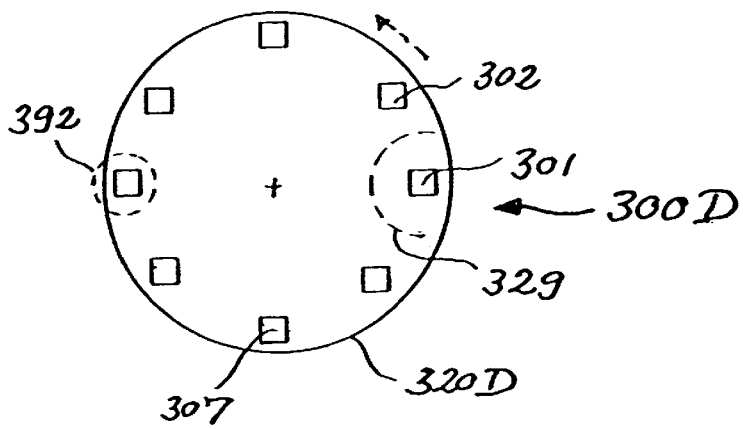

FIG. 9D depicts a mass-sensor assembly 300D having a circular rotatable sensor support 320D adapted to support an increased number of sensors, including a sensor 307.

Figure 10:
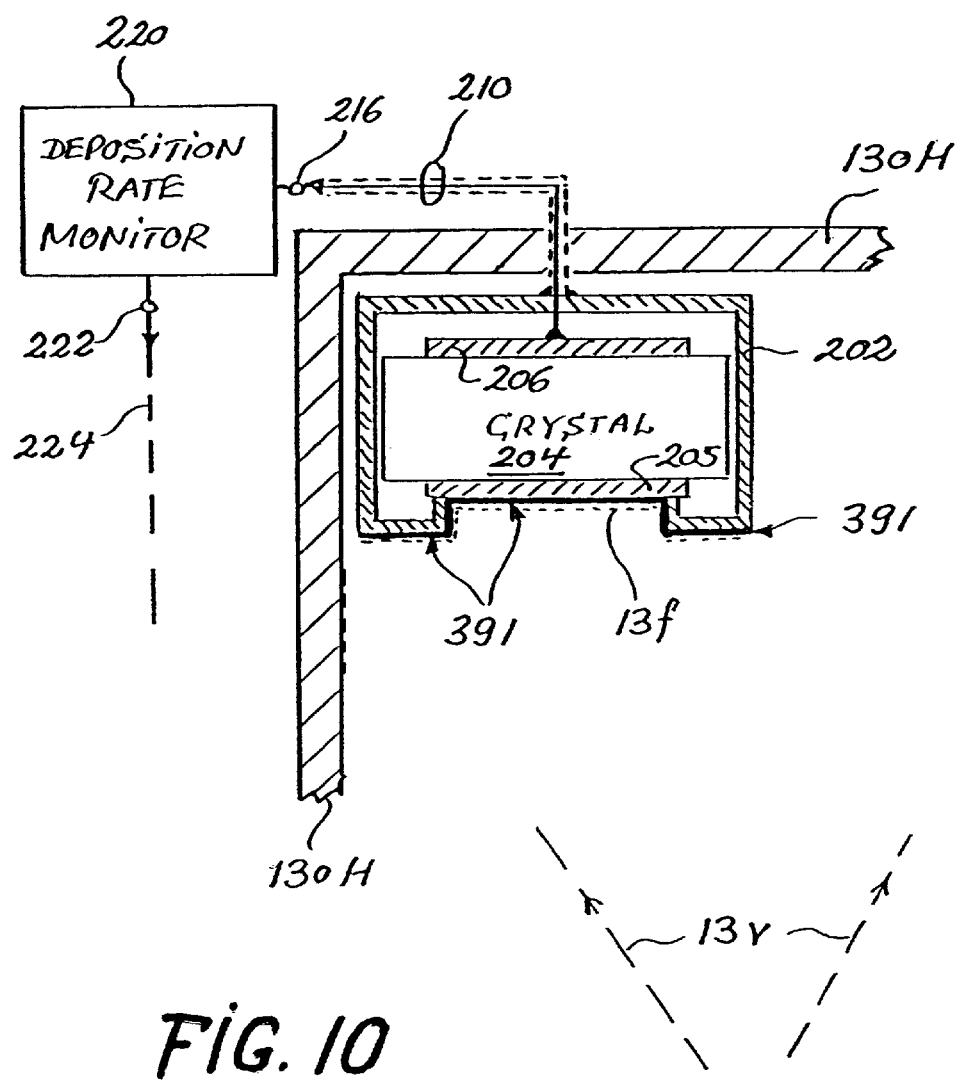
FIG. 10 is an enlarged section view of the crystal mass-sensor shown in FIG. 5, but having a radiation-absorbing layer preformed over the sensor surface for enhancing removal in whole or in part of the organic layers on the sensor in the cleaning position, in accordance with the invention.

FIG. 10 is an enlarged section view of the crystal mass-sensor shown in FIG. 5, but having a radiation-absorbing layer 391 preformed over the front electrode 205 of the crystal 204 and over front portions of the casing 202. The radiation-absorbing layer 391 can be a layer of radiation-absorbing carbon or other radiation-absorbing material for enhancing removal in whole or in part of accumulated organic layers on a sensor disposed on a movable sensor support which can be moved from a position in the deposition zone 13v to a cleaning position for removal of organic material by a radiation flash (see FIG. 7), by a radiation exposure (see FIG. 7C) or by a heater (see FIG. 8).

It will be appreciated that a sensor assembly having one or more sensors disposed on a movable sensor support can be effectively incorporated into each one of the vapor deposition stations 130, 140, and 150 of the OLED manufacturing system 100 shown in FIG. 2. Thus, each of these stations can provide monitoring and control of a vapor deposition rate by a conventional mass-sensor and deposition rate monitor, and to provide a reusable sensor or reusable sensors by complete or partial removal of organic material from mass-loaded sensors in a cleaning position along a path of motion of a movable sensor support.

The invention has been described in detail with particular reference to certain preferred embodiments thereof, but it will be understood that variations and modifications can be effected within the spirit and scope of the invention.

PARTS LIST

| | |
|---|---|
| 10 | organic light-emitting device (OLED) |
| 11 | substrate or structure |
| 12 | first electrodes |
| 13 | organic hole-transporting layer (HTL) |
| 13(xN) | number N of organic hole-transporting layers on mass-sensor |
| 13a | organic hole-transporting material |
| 13b | level of organic hole-transporting material |
| 13v | deposition zone of vapor of organic hole-transporting material |
| 13f | organic hole-transporting layer being formed |
| 14 | organic light-emitting layer (LEL) |
| 15 | organic electron-transporting layer (ETL) |
| 16 | second electrodes |
| 18 | encapsulation or cover |
| 100 | OLED manufacturing system |
| 102 | buffer hub |
| 103 | unload station |
| 104 | transfer hub |
| 105 | connector port |
| 106 | vacuum pump |
| 107 | pumping port |
| 108 | pressure gauge |
| 110 | load station |
| 110C | chamber |
| 110H | housing |
| 111 | carrier (for substrates or structures) |
| 130 | vapor deposition station (organic HTL) |
| 130C | chamber |
| 130H | housing |
| 131 | holder and/or mask frame |
| 132 | thermally insulative support |
| 134 | source |
| 135 | heating element(s) |
| 140 | vapor deposition station (organic LEL) |
| 150 | vapor deposition station (organic ETL) |
| 160 | vapor deposition station (second electrodes) |
| 170 | storage station |
| 180 | encapsulation station |
| 200 | crystal mass-sensor (PRIOR ART) |
| 202 | electrically grounded casing |
| 204 | crystal |
| 205 | front electrode |
| 206 | rear electrode |
| 207 | connection to rear electrode |
| 209 | connection to casing (and to front electrode) |
| 210 | lead |
| 216 | input terminal |
| 220 | deposition rate monitor |
| 222 | output terminal |
| 224 | lead |
| 226 | input terminal |
| 230 | controller or amplifier |
| 232 | output terminal |
| 234 | lead |
| 236 | input terminal |
| 240 | source (heating) power supply |
| 244 | output terminal |
| 245 | lead |
| 246 | output terminal |
| 247 | lead |
| 300 | mass-sensor assembly with reusable mass-sensor(s) |
| 300A | configuration of mass-sensor assembly |
| 300B | configuration of mass-sensor assembly |
| 300C | configuration of mass-sensor assembly |
| 300D | configuration of mass-sensor assembly |
| 301 | mass-sensor |
| 302 | mass-sensor |
| 303 | mass-sensor |
| 304 | mass-sensor |
| 307 | mass-sensor |
| 320 | sensor support |
| 320A | configuration of sensor support |
| 320B | configuration of sensor support |
| 320C | configuration of sensor support |
| 320D | configuration of sensor support |

-continued

PARTS LIST

| | |
|---|---|
| 321 | sensor contact |
| 323 | lead contact |
| 325 | rotator |
| 327 | seal |
| 329 | shield |
| 390 | cleaning flash unit |
| 390R | cleaning radiation unit |
| 391 | radiation-absorbing layer |
| 392 | light guide |
| 392B | light guide providing oblique incidence of cleaning radiation on the sensor |
| 392H | heater at tip of light guide |
| 392L | lens or lenses |
| 392M | mirror |
| 392HM | heater for mirror |
| 392T | trap (for collecting organic sublimate) |
| 392W | radiation-transmissive window |
| 395 | cleaning heater unit |
| 396 | lead |
| 398 | lead |
| 399 | heater |

What is claimed is:

1. A method for depositing an evaporated or sublimed organic layer onto a structure, in a vacuum chamber, which will form part of an organic light-emitting device, comprising the steps of:

a) depositing at a deposition zone, within the vacuum chamber, organic material forming a layer of the organic light-emitting device;

b) providing a movable sensor which, when moved into the deposition zone and is being coated during the depositing step, provides a signal representing the thickness of the organic material forming the layer;

c) controlling the deposition of the organic material in response to the signal to control a deposition rate and thickness of the organic layer formed on the structure;

d) moving the movable sensor from the deposition zone to a cleaning position within the vacuum chamber; and e) removing organic material from the movable sensor at the cleaning position to permit reuse of the movable sensor.

2. A method for depositing an evaporated or sublimed organic layer onto a structure, in a vacuum chamber, which will form part of an organic light-emitting device, comprising the steps of:

a) depositing at a deposition zone, within the vacuum chamber, organic material forming a layer of the organic light-emitting device;

b) providing at least first and second movable sensors each one of which, when moved into the deposition zone is coated during a deposition of organic material and provides a signal representing the thickness of the organic material forming the layer;

c) controlling the deposition of the organic material in response to the signal to control a deposition rate and thickness of the organic layer formed on the structure;

d) moving the first movable sensor after it has been coated with organic material from the deposition zone to a cleaning position within the vacuum chamber;

e) moving the second movable sensor into the deposition zone; and f) removing organic material from the first movable sensor at the cleaning position to permit reuse of the first movable sensor.

* * * * *